US007446130B2

(12) United States Patent
Maskaly et al.

(10) Patent No.: US 7,446,130 B2
(45) Date of Patent: Nov. 4, 2008

(54) IONIC COLLOIDAL CRYSTALS

(75) Inventors: Garry R. Maskaly, North Quincy, MA (US); Yet-Ming Chiang, Framingham, MA (US); W. Craig Carter, Jamaica Plain, MA (US); R. Edwin Garcia, Washington, DC (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 10/424,672

(22) Filed: Apr. 27, 2003

(65) Prior Publication Data

US 2005/0250856 A1    Nov. 10, 2005

(51) Int. Cl.
*B01F 3/12* (2006.01)
*F21V 9/14* (2006.01)

(52) U.S. Cl. ............. 516/31; 516/77; 516/924; 516/929; 252/582; 252/585; 252/588

(58) Field of Classification Search ......... 252/582–589; 516/31
See application file for complete search history.

(56) References Cited

U.S. PATENT DOCUMENTS

| | | | | |
|---|---|---|---|---|
| 5,167,271 | A | * 12/1992 | Lange et al. | 164/103 |
| 5,545,428 | A | 8/1996 | Crimp et al. | 427/8 |
| 5,554,215 | A | 9/1996 | Simpson et al. | 106/436 |
| 6,200,464 | B1 | 3/2001 | van Houtert et al. | 208/119 |
| 6,368,993 | B1 | 4/2002 | Kim et al. | 501/95.2 |
| 6,924,921 | B2 * | 8/2005 | Lewis et al. | 359/296 |
| 2002/0000398 | A1 * | 1/2002 | Skold | 209/214 |
| 2003/0091647 | A1 * | 5/2003 | Lewis et al. | 424/490 |

OTHER PUBLICATIONS

Yoshimura et al., Order Formation in Binary Mixtures of Monodisperse Latics, Progress in Colloid & Polymer Science, 68, 59-70, 1983.*
Hachisu et al., Order Formation in Binary Colloids (Colloidal Alloys in Binary Latexes), Physics of Complex Supermolecular Fluids, Safran and Clark, ed.s, New York, Wiley, 221-240, 1987.*
Barlett, et al., "Superlattice Formation in Binary Mixtures of Hard-Sphere Colloids," *Phys. Rev. Lett.* 68(25): 3801-3805, Jun. 1992.
Schofield, "Binary hard-sphere crystals with the cesium chloride structure," *Phys. Rev. E* 64(051403): 1-4, Oct. 2001.
Velikov, et al., "Layer-by-Layer Growth of Binary Colloid Crystals," *Science* 296: 106-109, Apr. 2002.
Soto, et al., "Controlled Assembly of Mesoscale Structures Using DNA as Molecular Bridges," *J. Am. Chem. Soc.* 2002(124): 8508-8509, Jul. 2002.
Leunissen, et al., *Nature*, 437:235-240, 2005.
Hynninen, et al., *Physical Review Letters*, 96:138308(-1)-13808(-4), 2006.

* cited by examiner

*Primary Examiner*—Randy Gulakowski
*Assistant Examiner*—Timothy J. Kugel
(74) *Attorney, Agent, or Firm*—Choate Hall & Stewart, LLP; Sam Pasternack

(57) ABSTRACT

Ionic colloidal crystals (ordered multicomponent colloids formed by attractive electrostatic interactions) may be produced by controlling the surface potential and relative size of multiple populations of colloidal particles in suspension. Such suspensions are dried or otherwise caused to precipitate out the particles in ordered arrays. The crystal structure of the arrays may be controlled by appropriate choices of particle materials, sizes, and charge ratios.

61 Claims, 5 Drawing Sheets

IONIC COLLOIDAL CRYSTALS

FIELD OF THE INVENTION

The present invention is directed to binary colloidal crystals, and in particular to colloidal crystals that are stabilized by Coulombic forces.

BACKGROUND OF THE INVENTION

Monodisperse colloidal particles are recognized for their ability to form a variety of crystalline structures that are being considered for a wide range of technologies, including photonics (as photonic crystals or as pigments), catalysis, electrochemical devices (e.g., fuel cells and batteries), biomaterials, and drug delivery vehicles. Various structures have been produced using hard-sphere packing mechanisms, including face-centered cubic and body-centered cubic arrangements.

Binary colloidal crystals (ordered arrays of two particle types) have also been produced, using long-range electrostatic or steric repulsive forces (Velikov, et al., Science 296: 106, 2002), short-range attractive interactions such as DNA bridges (Soto, et al., J. Am. Chem. Soc. 2002(124):8508, 2002), or contact hard-sphere interactions (see Bartlett, et al., Phys. Rev. Lett., 68(25):3801, 1992, and Schofield, Phys. Rev. E 64:051403, 2001). While a wider variety of systems can be achieved using binary particle systems, current methods limit crystal structures to the types found in metallic systems (e.g., the CsCl structure, which is found in the Cu—Zn and Al—Ni alloy systems).

SUMMARY OF THE INVENTION

In one aspect, the invention comprises an ionic colloidal crystal (ICC). The ICC comprises an ordered array of particles, including a first group of particles of a first composition and a second group of particles of a second composition. The groups of particles have opposing surface charge, and the ordered array is stabilized primarily by Coulombic interactions between the two compositions. The ICC may have a volume of two, four, ten, fifty, or more unit cells, and may take on ionic crystal structures such as rock salt, cesium chloride, zincblende, wurtzite, fluorite, rutile, ruthenium oxide, or corundum. The particles may be substantially spherical, and each group may have a substantially uniform diameter. They may have a selected surface charge and Debye length. The particles may be coated or functionalized. The crystallite may further comprise a liquid medium, and the surface charges of the particles may be determined by the composition of the liquid medium. The particles may be nonspherical and/or may carry anisotropic surface charge. The ordered array may be additionally stabilized by van der Waals forces, depletion forces, or external directional forces.

The invention further comprises a photonic crystal comprising an ICC as described above, which may, for example, have a wurtzite or zincblende structure. The invention also comprises a self-assembled laser comprising the ICC as described above, where at least one of the groups of particles fluoresces at a selected wavelength, and the ICC has a photonic bandgap that prohibits fluorescence at that wavelength. The invention also comprises an active material comprising an ICC as described above, where at least one type of particle is electro-optic, magneto-optic, ferroelectric, ferromagnetic, electrostrictive, or magnetostrictive. The invention also comprises a nonlinear conduction device comprising an ICC as described above, where the particles of the two groups form rectifying junctions (e.g., Schottky junctions or p-n junctions). The invention also comprises a catalyst comprising an ICC as described above.

In another aspect, the invention comprises methods of preparing ICCs. One such method includes providing first and second suspensions of particles of a first and second composition in a first and second solvent, and mixing the first and second suspensions to form a mixed suspension. The first and second compositions of particles take on opposing charges in the mixed suspension. Finally, the particles are coagulated out of the mixed suspension to form an ordered array stabilized primarily by Coulombic forces. Alternatively, instead of mixing, the two suspensions may be coagulated by sequential addition of the first and second suspensions. If the suspensions are mixed, mixing may take place adjacent to the ordering site. Coagulating may include depositing particles on a surface, which may promote ordering of the formed array. The surface may include lines, gratings, ledges, steps, grids, or ordered particles. A directional force, such as a gravitational or centrifugal force, or an electric or magnetic field, may be applied during coagulation. The particles may form crystal structures such as rock salt, cesium chloride, zincblende, wurtzite, fluorite, rutile, ruthenium oxide, or corundum. The particles may be substantially spherical, and each group may have a substantially uniform diameter. They may have a selected surface charge and Debye length. The particles may be coated or functionalized. The crystallite may further comprise a liquid medium, and the surface charges of the particles may be determined by the composition of the liquid medium. The particles may be nonspherical and/or may carry anisotropic surface charge. The ordered array may be additionally stabilized by van der Waals forces, depletion forces, or external directional forces. Kinetic energy may be added to the mixed suspension during coagulation, for example by ultrasonification, fluid flow, agitation, or alternating electric or magnetic fields.

In still another aspect, the invention comprises a method of selecting materials for an ionic colloidal crystallite to obtain a desired crystal type having a selected stoichiometry. The method comprises selecting at least a first and a second particle composition, a first and a second particle radii $a_1$ and $a_2$, and a solvent composition. Particles of the first composition suspended in the solvent have a surface potential of $\Psi_1$, particles of the second composition suspended in the solvent have a surface potential of $\Psi_2$, and the solvent has a reciprocal Debye length of $\kappa$. The method further comprises calculating a charge ratio Q as $$-\frac{a_1 \Psi_1 \exp(\kappa a_1)}{a_2 \Psi_2 \exp(\kappa a_2)},$$

calculating a dimensionless length $\Lambda$ as $\kappa(a_1+a_2)$, calculating an ionic radius ratio r as $$\frac{a_1}{a_2},$$

and using Pauling's Rules and r to determine favored crystal structure types. The method further comprises calculating the Madelung constant for each favored crystal type having a stoichiometry matching the selected stoichiometry, determining the stable phase as the favored crystal type having the highest Madelung constant, and adjusting the selected first and second particle compositions, first and second particle sizes, and solvent compositions until the stable phase matches the desired crystal type.

BRIEF DESCRIPTION OF THE DRAWING

The invention is described with reference to the several figures of the drawing, in which.

DEFINITIONS

Figure 1:
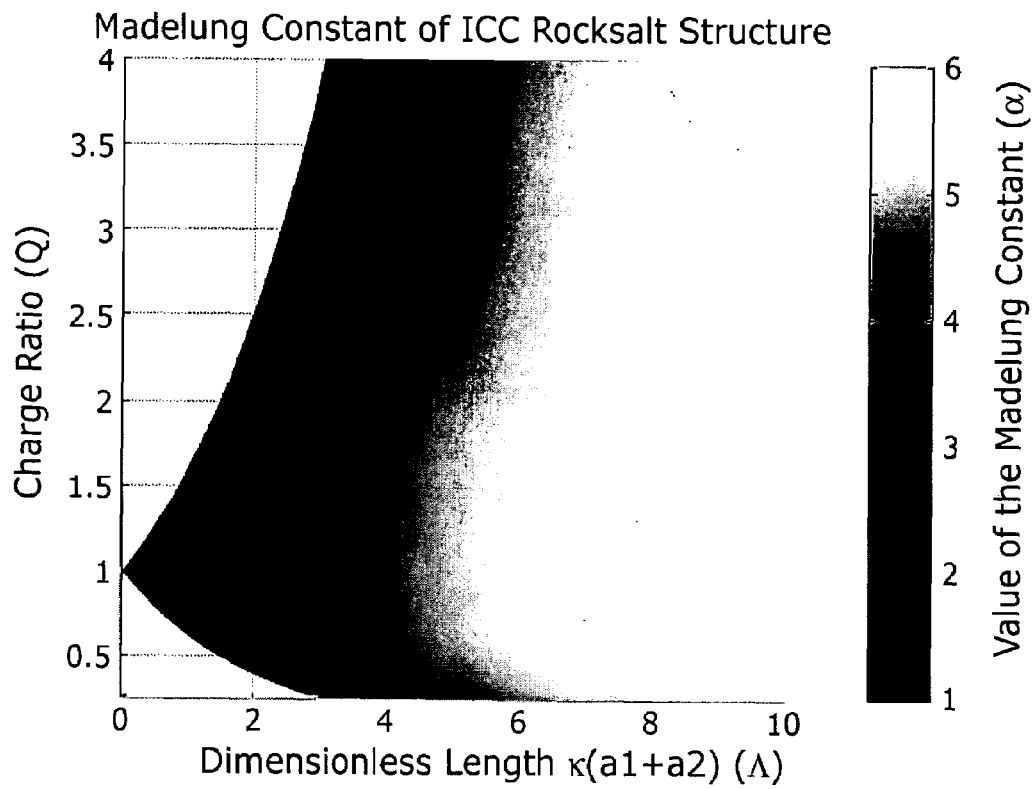
FIG. 1 shows the Madelung constant for the rock salt structure as a function of the dimensionless charge ratio (Q) and the dimensionless length ($\Lambda$)

As used herein, a "crystal" or "crystallite" is an ordered array structure formed by arrangement of particles or atoms on a crystal lattice. An ordered arrangement of particles is considered to form a crystal or crystallite if it includes an ordered region having a volume equivalent to at least one unit cell of the crystal structure.

As used herein, "depletion forces" are osmotic pressures arising when molecules or particulates in suspension, typically of much smaller size than the colloidal particles being aggregated, are depleted from the constrained volume between particles for entropic reasons, thereby adding an additional attractive force tending to bring the colloidal particles together.

As used herein, "van der Waals forces" includes all weak intermolecular forces, including without limitation London dispersion forces, Keesom forces, Debye forces, and Casimir forces.

As used herein, "gravitational forces" includes all externally applied directional forces, including inertial forces such as centrifugal force.

As used herein, a "functionalized" particle is one that has an organic or inorganic chemical bonded to its surface, where the free end of the chemical has a desired radical or structure.

As used herein, "Pauling's Rules" refer to the relationship between the ratio of ionic radii and crystal structure of ionic crystals:

| ratio of ionic radii | coordination number | Crystal type |
| --- | --- | --- |
| 1.0-0.732 | 8 | Cubic |
| 0.732-0.414 | 6 | Octahedral |
| 0.414-0.225 | 4 | Tetrahedral |
| 0.225-0.155 | 3 | Triangular |
| <0.155 | 2 | Linear |

DETAILED DESCRIPTION

Colloidal crystals, or ordered arrays of particles, can be synthesized and, like naturally occurring silica-based colloidal crystals such as opal, possess physical properties that derive from their mesostructure. Most colloidal crystals are based on the ordered packing of a single, typically spherical, particle type. We have found that electrostatic stabilization concepts from classical ionic crystal chemistry can be extended to the mesocopic scale to produce self-organizing, binary "ionic" colloidal crystals. We have shown analytically and experimentally that a binary colloidal suspension containing oppositely-charged particles can lower its electrostatic energy by ordering in various ionic crystal structure-types. The capability for synthesizing entirely new classes of colloidal crystals is expected to find applications in a broad range of fields including photonics, catalysis, pharmaceuticals, and ferroic materials.

To our knowledge, multicomponent colloidal crystals produced using long-range attractive Coulombic forces have not been produced. Heterocoagulation, or the coagulation of dissimilar particles through attractive Coulombic forces, typically results in a low packing density noncrystalline structure such as that obtained during reaction-limited cluster aggregation (RLCA) or diffusion-limited cluster aggregation (DLCA) (see, e.g., Kim, et al., *J. Colloid and Interf. Sci.* 229:607, 2000; Fenandez-Nieves, et al., *Phys. Rev. E* 6405: 51603, 2001; AlSunaidi, et al., *Phys. Rev. E* 61:550, 2000). In these cases, the structures exhibit no long-range order because the large interparticle binding energy relative to the thermal energy in such systems resists structural rearrangement. We have identified conditions under which heterocoagulation into ionic colloidal crystals (ICCs) is energetically favored over primary heterocoagulates (such as isolated dipolar particle pairs). A dimensionless length, $\Lambda$, characterizing the spatial range of the electrostatic interaction, and a ratio of particle effective charges, Q, are used to characterize a parameter space in which ICC formation is energetically favorable. We have found that the conditions required for ordered heterocoagulation are quite restrictive, possibly explaining why ICCs have not been reported previously. An experimental system satisfying these conditions has been created and used to demonstrate ionic colloidal crystallization of two dissimilar sphere types into the rock salt structure.

Interparticle Potential

The formation energy of an ionic colloidal crystal can be calculated from the sum of all interactions between similar and dissimilar particles. The theory of Derjaguin, Landau (Derjaguin, et al., *Acta physicochimica* 14:633, 1941, incorporated by reference herein), Verwey, and Overbeek (Verwey, et al., *Theory of the stability of lyophobic colloids*, Elsevier Pub. Co., New York, 1948, incorporated by reference herein) ("DLVO" theory) is commonly applied to the homocoagulation of similar colloidal particles. However, for dissimilar particles, the theory must be modified to account for the differences in particle size, and the sign and magnitude of the surface charge. The theory of Hogg, Healy, and Fuerstenau (HHF) (Hogg, et al., *Trans. Faraday Soc.* 62:1638, 1966, incorporated by reference herein) extends the DLVO theory to heterocoagulated systems. Inherent in HHF theory are several approximations including the linearization of the Poisson-Boltzmann equation (PBE) and the Derjaguin approximation (Derjaguin, *Kolloid Z.* 69:155, 1934, incorporated by reference herein).

Under the linear PBE, which is a good approximation when the surface potential is small (see Islam, et al., *Adv. in Colloid and Interf. Sci.* 62:109, 1995), the potential fields from neighboring particles can be superimposed. However, under the nonlinear PBE the total electrostatic energy cannot be determined through the pairwise summation of the interaction energies of all particles, but instead requires the numerical calculation of the energy for each specific arrangement of particles. In our analysis, we assume the linear PBE to be valid. However, we do not use the Derjaguin approximation, for the following reasons. In the limit of very small salt concentration, the HHF potential falls off more slowly than the 1/r dependence seen in an unshielded electrostatic system. This behavior is unphysical and is a direct result of the Derjaguin approximation where the spheres are treated as a superposition of flat plates, which would interact with a constant potential field were no shielding present. Futherermore, the HHF potential diverges as two spheres with opposite signs of surface charge come into contact.

Thus, we have developed a theory with broader applicability than HHF, starting from the linearized Poisson-Boltzmann equation:

$$\nabla^2 \psi = \kappa^2 \psi - \frac{\rho}{\varepsilon_0 \varepsilon_r} \quad (1)$$

Here $\psi$ is the electrostatic potential field, $\kappa$ is the Debye parameter, and $\rho$ is the spatial distribution of fixed charges in the system (i.e., on particle surfaces). This equation has a Green's function solution that is of Yukawa-type:

$$G(\vec{R} - \vec{R}') = \frac{Q}{4\pi\varepsilon_0\varepsilon_r} \frac{\exp(-\kappa|\vec{R} - \vec{R}'|)}{|\vec{R} - \vec{R}'|} \quad (2)$$

Here Q is the magnitude of the point charge, R is a vector of an arbitrary origin, and R' is the vector position of the charge center from that origin.

It is assumed that the spatial distribution of charge remains fixed throughout. This assumption, corresponding to a constant surface charge on the particles, is one of two commonly used surface boundary conditions in colloids, the other being the assumption of a constant surface potential. A constant surface potential boundary condition is unphysical, since two touching spheres with different surface potentials have a divergent electric field at the point of contact, resulting in an unbounded total energy. In contrast, the internal energy of two particles with constant surface charge density is finite everywhere.

Integration of the Green's function over a sphere of radius $a_1$ with a uniform charge density yields a spatially-varying potential that is identical to that of a point charge of magnitude $\Psi_1 a_1 \exp(\kappa a_1)$, where $\Psi_1$ is the surface potential of the particle, and r is the distance from the center of the particle:

$$\psi(r) = a_1 \Psi_1 \exp(\kappa a_1) \frac{\exp(-\kappa r)}{r} \quad (3)$$

The solution in (3) only applies outside of the charged particle. In the case of an isolated particle, this is identical to a sphere with a constant surface potential of $\Psi_1$. This constant surface potential can be used to determine the surface charge for an isolated particle. As in previous theories, the potential need not be fixed at the physical surface of the particle, but can be fixed at any shell of constant potential. In the case of the Stern approximation, the surface potential is replaced by the zeta potential, making the surface charge an effective charge equal to the difference between the bound surface charges and the trapped counterions in the Stern layer.

Using Equation (3), the interaction energy of two particles separated by a distance r is the product of the potential field of one particle and the charge of the other, evaluated at the separation distance:

$$U(r) = 4\pi\varepsilon_0\varepsilon_r a_1 a_2 \Psi_1 \Psi_2 \exp(\kappa a_1 + \kappa a_2) \frac{\exp(-\kappa r)}{r} \quad (4)$$

The interaction energy for homocoagulation has also been calculated by an alternative method that results in a Yukawa-type potential.

$$U(r) = \frac{Z^2 e^2}{4\pi\varepsilon_0\varepsilon_r} \left[\frac{\exp(\kappa a)}{1 + \kappa a}\right]^2 \frac{\exp(-\kappa r)}{r} \quad (5)$$

where a is the radii of the particles and Z is the amount of charge on the particle surface. In this method, the surface charge is set to the value of all counterions in solution above the equilibrium concentration, effectively imposing a zero net system charge constraint. This method yields results identical to ours for an isolated particle. However, to our knowledge, a Yukawa-type potential has not been applied to heterocoagulation.

The relation between surface charge and surface potential for an isolated particle is:

$$\Psi_{surf} = \frac{Z_{surf} e}{4\pi\varepsilon_0\varepsilon_r(1 + \kappa a)a} \quad (6)$$

Using (4), we obtain the correct 1/r dependence of the potential field in the limit of zero Debye parameter (no shielding ions), while allowing the energy to remain bounded at particle contact ($r = a_1 + a_2$). This allows the calculation of the interaction energy for a system of contacting charged spheres, whether they are of like or opposite charge.

Madelung Constants for Ionic Colloidal Crystals

The Madelung constant of an ionic crystal, used as a measure of crystalline stability, is the idealized electrostatic energy of the crystalline array relative to that of the same number of atoms present as isolated molecules. In the case of ICCs, we likewise use a Madelung sum to compare the electrostatic energy of various structure types to an equal number of isolated particle arrangements, and to each other. Two key distinctions between colloidal and classical ionic crystals are noted. In ionic crystals, ion sizes and valences are limited to those available in the Periodic Table, while for colloidal crystals, the particle size and surface charge can be continuously varied, to some extent independently. In conventional ionic crystals, charge neutrality is solely provided by the ions of opposite charge, while in colloidal systems, the counterion space-charge cloud provides an additional charge-compensation mechanism. The impact of these fundamental differences can be seen in the following results.

The classical Madelung sum, which converges weakly without the use of special techniques, is a summation of the electrostatic interactions between one ion and all other ions in a crystal. For a binary compound, this is:

$$U = \frac{1}{4\pi\varepsilon_0\varepsilon_r}\left(\frac{N_1 Q_1 Q_2}{r_1} + \frac{N_2 Q_1 Q_1}{r_2} + \frac{N_3 Q_1 Q_2}{r_3} + \ldots\right) \quad (7)$$

where $N_i$ is the number of identical ions at distance $r_i$ and $Q_j$ is the absolute value of charge of the $j^{th}$ particle. As an example, for the rock salt structure type this energy is:

$$U = \frac{e^2}{4\pi\varepsilon_0\varepsilon_r}\left(-\frac{6}{r_0} + \frac{8}{\sqrt{2}\,r_0} - \frac{12}{\sqrt{3}\,r_0} + \ldots\right) \quad (8)$$

where $r_0$ is the interionic separation. Upon normalizing this energy by the Coulombic energy of an isolated particle pair at the equilibrium separation, the Madelung constant is obtained:

$$\alpha = 6 - \frac{8}{\sqrt{2}} + \frac{12}{\sqrt{3}} + \ldots = 1.748 \quad (9)$$

In the case of ionic colloidal crystals, we substitute the Yukawa type potential in (4) for the simple Coulombic interaction. The potential still includes two charges ($Q_i$) and an $1/r$ dependence, but there is now an exponential decay to account for counterion shielding in the solution. The potential energy summation for a binary ICC structure is, in the general case:

$$U = \frac{1}{4\pi\varepsilon_r\varepsilon_0}\Big(N_1 Q_1 Q_2 \frac{\exp(-\kappa r_1)}{r_1} + \\ N_2 Q_1 Q_1 \frac{\exp(-\kappa r_2)}{r_2} + N_3 Q_1 Q_2 \frac{\exp(-\kappa r_3)}{r_3} + \ldots\Big) \quad (10)$$

This equation reduces to (7) as the inverse Debye length $\kappa$ goes to zero, making the ICC formulation and the Coulombic formulation identical in this limit of no counterion shielding. Note that the oppositely charged particles do not necessarily have equal magnitude of charge. The summation is then normalized by the energy of an isolated pair (for a crystal of 1:1 particle ratio) to obtain the Madelung constant:

$$\alpha = N_1 + N_2 \frac{Q_1}{Q_2}\frac{r_1}{r_2}\exp(\kappa r_1 - \kappa r_2) + N_3 \frac{r_1}{r_3}\exp(\kappa r_1 - \kappa r_3) + \ldots \quad (11)$$

This result explicitly includes the particle effective charges and the Debye length ($\kappa^{-1}$). We next introduce two dimensionless parameters, each with a clear physical significance:

$$Q = -\frac{Q_1}{Q_2} = -\frac{a_1\Psi_1\exp(\kappa a_1)}{a_2\Psi_2\exp(\kappa a_2)} \quad (12)$$

$$\Lambda = \kappa r_1 = \kappa(a_1 + a_2) \quad (13)$$

Q is the ratio of the effective charges, which are the point charge equivalents of the colloidal particles, directly analogous to the effective valence of ions. The dimensionless length, $\Lambda$, is the Debye length normalized to the sum of the particle radii, and gives the spatial extent of the potential with respect to the interparticle separation. Here particles 1 and 2 are chosen so that the ratio Q has a value greater than one. The Madelung sum now depends only on these two dimensionless parameters and the spatial arrangement of particles:

$$\alpha = N_1 - N_2 Q \frac{1}{c_2}\exp(\Lambda - \Lambda c_2) + N_3 \frac{1}{c_3}\exp(\Lambda - \Lambda c_3) + \ldots \quad (14)$$

Here $c_i$ is the ratio of the $i^{th}$ distance to the sum of particle radii ($a_1+a_2$), and $N_i$ is the number of identical particles at the distance $r_i$. For any structure type, the ICC Madelung constant can be calculated as a function of the two dimensionless parameters. Applying (14) to the rock salt structure type as an example, the first terms of the Madelung sum are:

$$\alpha = 6 - 12Q\frac{1}{\sqrt{2}}\exp(\Lambda - \Lambda\sqrt{2}) + 8\frac{1}{\sqrt{3}}\exp(\Lambda - \Lambda\sqrt{3}) + \ldots \quad (15)$$

FIG. 1 shows the Madelung constant for the rock salt structure as a function of the dimensionless charge ratio (Q) and the dimensionless length ($\Lambda$). Where $\alpha$ is greater than 1, the ICC is energetically favorable compared to a system of isolated particle pairs. At high values of $\Lambda$, the Madelung constant approaches 6, corresponding to nearest-neighbor attraction alone. At lower values of $\Lambda$, next-nearest-neighbor repulsion becomes more significant, allowing long-range ordering to be energetically favorable. The regions shown in solid blue have a Madelung constant below 1 and are not stable. The figure is reciprocally symmetric about Q=1.

Figure 2:
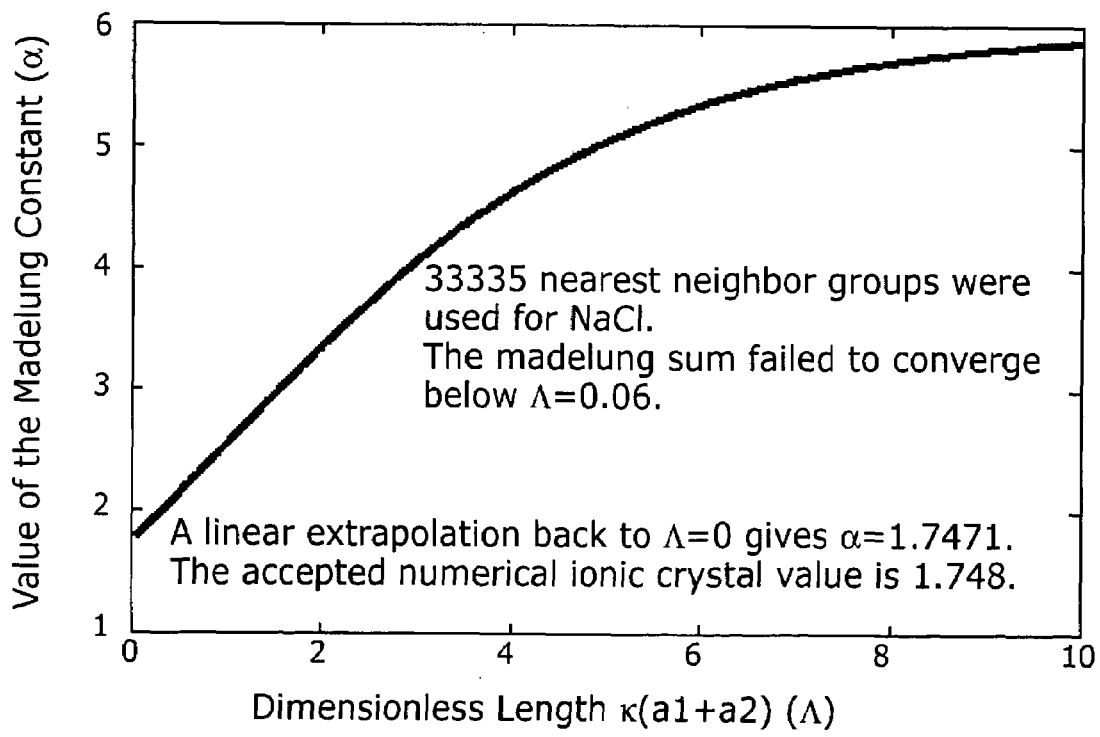
FIG. 2 shows the converging values of the Madelung sum for Q=1 in a rock salt structure.

FIG. 2 shows the converging values of the Madelung sum for Q=1 in a rock salt structure as $\Lambda$ approaches zero. The calculation for the Madelung sum failed to converge below $\Lambda$=0.06 for our calculations. A linear extrapolation found a value of $\alpha$=1.7471 at $\Lambda$=0; the accepted numeric ionic crystal value is 1.748.

Note in FIG. 1 that at a charge ratio of Q=1, and a 1:1 particle stoichiometry, the two types of particles can charge-compensate one another without requiring a contribution from the counterions. No net motion of counterions in the solution is required to make the structure electrically neutral. These conditions yield the largest Madelung sum, for any value of $\Lambda$. Note also that at large values of $\Lambda$ (small Debye length) the Madelung constant approaches the value 6 for all charge ratios. This is due to the screening of all but the 6 first-nearest-neighbors in the rock salt structure type. (The energy difference between disordered and ordered structures is not explicitly shown in FIGS. 1 and 2.)

Phase Diagram Representation

Figure 3:
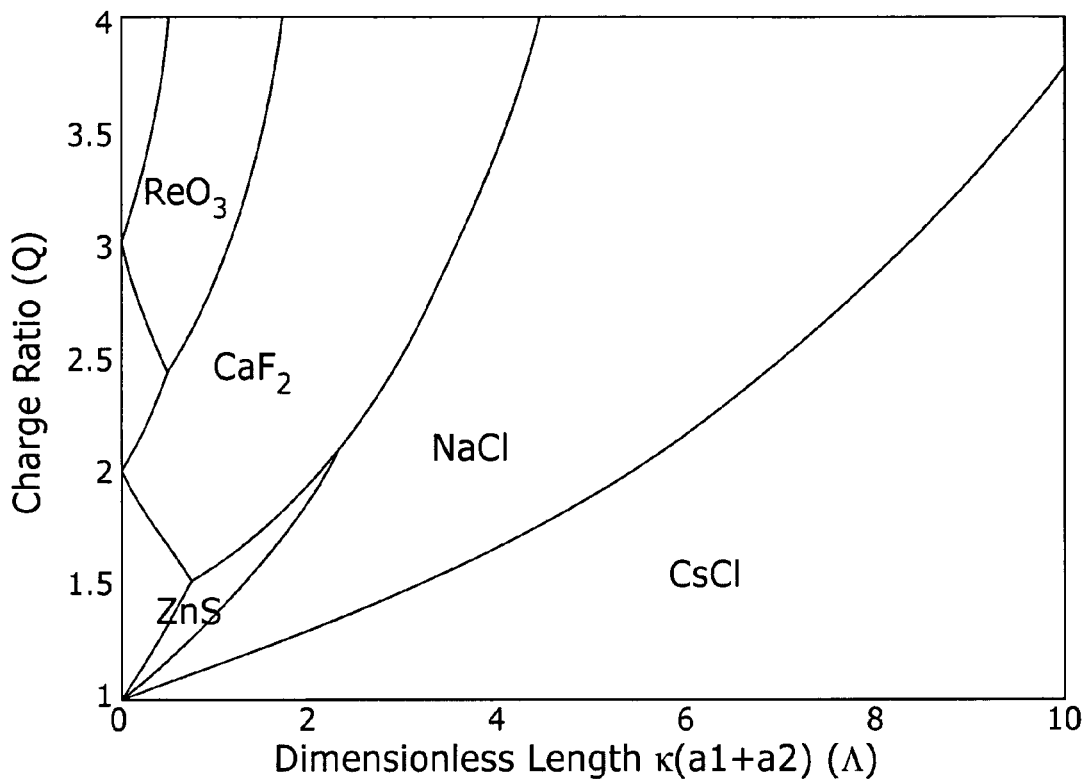
FIG. 3 is a phase diagram showing stability fields for five ICC structure types as a function of Q and $\Lambda$.

The stability of various ICC structures that can in principle crystallize from a single binary suspension can be compared using a phase diagram with Q and $\Lambda$ as the axes, as shown in FIG. 3. In this diagram, each field represents the structure having the highest Madelung constant at the given values of the dimensionless parameters. (Other structures can still be energetically stable.) The diagram is reciprocally symmetric about Q=1, however the size ratio limitations change. For example, $CaF_2$ has the highest charged ion in an octahedral site and the other in a tetrahedral site. The size ratio of the ions must allow the proper ion to sit in the appropriate site.

Five elementary ionic crystal structures of AB, $AB_2$, and $AB_3$ type have been selected for illustration in FIG. 3. Since the stoichiometries of the crystals vary from 1:1 to 1:3, the Madelung sums of each structure type have been normalized to the energy of a stoichiometric molecule with a configuration giving the lowest Coulombic energy. For a 3:1 crystal the primary unit is triangular, while for a 2:1 crystal it is linear. The fields shown each represent the most stable structure having a Madelung constant greater than one. At small values of $\Lambda$, the fields become narrower because the potentials are farther reaching, and fields of Madelung constant less than one arise, due to the greater influence of repulsion between particles of like charge. The fields converge at zero $\Lambda$ to charge ratios that reflect the stoichiometry of the crystal. For phases of other stoichiometries not shown here, such as an $A_2B_3$ structure, a field that converges at the ideal stoichiometry would result (e.g., $Q=1.5$ for $A_2B_3$). At small values of $\Lambda$, structures containing ordered vacancies may exist in the regions between stable fields, for example between cesium chloride (CsCl) and fluorite ($CaF_2$) fields. This occurs in ionic materials in the form of structure types such as bixbyite and pyrochlore. Ordered defect structures may also exist between the rock salt (NaCl) and wurtzite (ZnS) fields. One of ordinary skill in the art will be able to compute the Madelung constants for these and other alternative structures using the methods described herein. FIG. 3 also does not include the effect of particle radius ratio (Pauling's first rule), which leads to further discrimination between structures, as discussed below.

Specific Particle Systems

We next consider a binary particle system in which the sizes of the two particles as well as their surface charge densities are fixed. The latter may be accomplished by surface functionalization and/or by equilibration with the solution in which the particles are suspended. (Dissimilar colloidal particles can be made to take on opposite charges in a single liquid solution, for instance if the pH of the solution induces one particle to have a positive and the other a negative surface potential/zeta potential.) The surface charges determine the surface potentials of equivalent isolated particles. Q and $\Lambda$ are then interrelated, and using equations (12) and (13), the Debye parameter ($\kappa$) can be eliminated to obtain $Q(\Lambda)$ as a function of the particle properties, the size ratio, $R_{size}=a_1/a_2$, and the ratio of the particle surface potentials $R_\Psi=\psi_1/\psi_2$:

$$Q(\Lambda) = -R_{Size}R_\Psi \exp\left(\Lambda \frac{R_{Size}-1}{R_{size}+1}\right) \quad (16)$$

Figure 4:
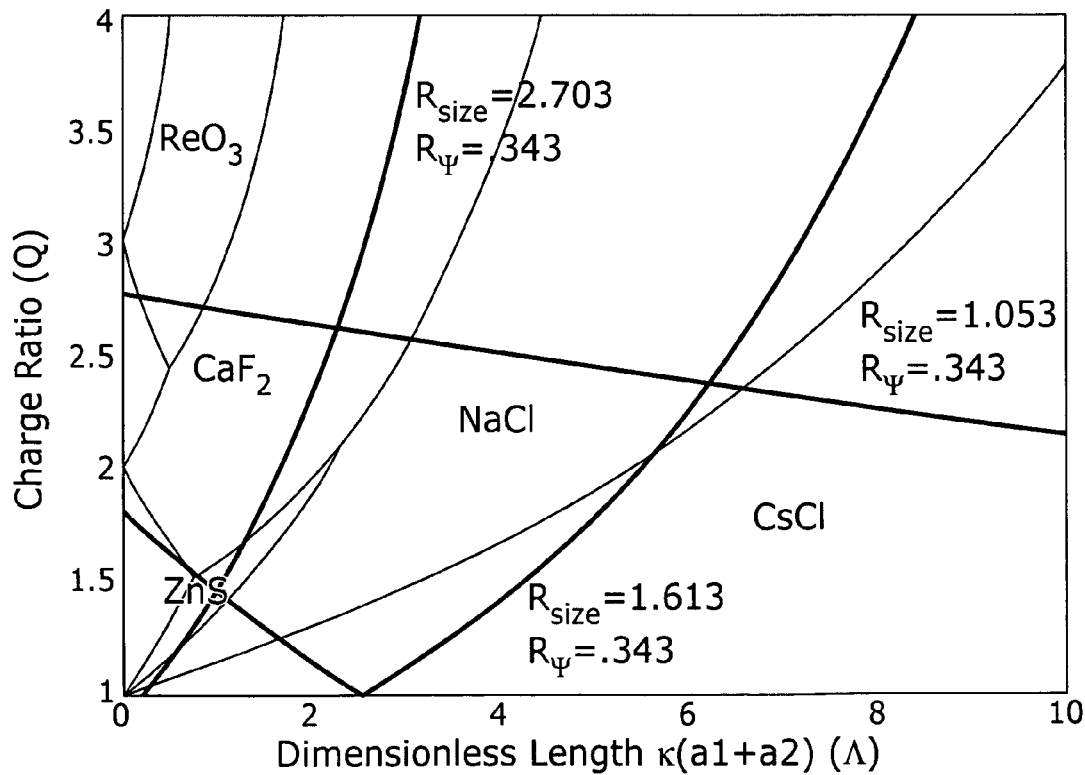
FIG. 4 superimposes Q($\Lambda$) functions for three selected material systems onto the phase diagram of FIG. 3.

Note that since the surface potential can be taken to be the zeta potential without loss of generality, $R_\Psi$ ovaries with salt concentration. This dependence can be included when calculating $R_\Psi$. FIG. 4 plots this relationship for several particle sizes at a surface potential $R_\Psi=-0.343$. The only variable remaining on these lines is the counterion concentration. A line with a negative slope is in a region where the smaller particle is carrying the largest effective charge. As the counterion concentration increases, the effective charge of the larger particle increases more quickly. At $Q=1$, the line changes slope as the larger particle begins to carry the larger charge. As the size ratio increases, the slope of the line becomes steeper, making control of the solvent properties more critical. Note that the region the line lies in may not be the dominant phase due to the constraint of Pauling's First Rule, which requires a certain size ratio to fill a site.

For a given value of the Debye parameter, fixed by the choice of salt concentration, solvent dielectric constant, and temperature, the values of Q and $\Lambda$ are determined by the particle sizes and surface potentials. Conversely, if the particle sizes and surface potentials have been pre-selected through the choice of starting materials, the co-existing values of Q and $\Lambda$ are determined by the Debye parameter. In either instance, various stability fields within the phase diagram can be accessed through control of the system properties. Combined with control of the particle number ratio (stoichiometry) and size ratio (Pauling's first rule), the most stable structure can be predicted for a given binary colloid system.

These results provide insight into how structures can be selected in practice. FIG. 4 shows that for similar particle sizes ($R_{size}$ approximately 1), the slope of the function (16) is nearly zero, indicating little sensitivity of the charge ratio to counterion concentration. As the particle size ratio becomes larger, however, Q increases exponentially with $\Lambda$ and is highly sensitive to counterion concentration. A value for Q of less than 1 implies that the surface potential on the smaller particle is greater than that on the larger particle, which may be difficult to achieve. Further, it is very difficult to obtain a useful charge ratio (Q less than 4) if the surface potentials are similar, but the particle sizes are very different. If Q is very much larger than 4, crystalline order will be less favorable than forming local clusters with the highly charged particle at the center, surrounded on all sides by the lower charged particles. The control of Q is therefore important for obtaining ordered structures. As a practical example, to obtain the wurtzite (ZnS) structure, a size ratio between 2.415 (to inhibit the formation of rock salt) and 6.452 (to allow the filling of a tetrahedral site) are desired, as is a charge ratio of nearly one. To satisfy these conditions, the smaller particle must have a much larger surface potential than the larger particle, and, for small values of the Debye parameter, the surface potential on the small particle must be approximately $R_{size}$ times larger than that of the large particle.

Crystal Preparation

The present heterocoagulation-based colloidal crystallization approach may have significant processing advantages over single-component crystallization, being based on attractive rather than repulsive interactions. Crystallization can be more rapid; indeed the nucleation of ICCs may occur within the suspension rather than being determined by the rate of particle settling. Continuous processes using particle mixing can be developed using the techniques described herein. However, growth techniques must appropriately favor controlled growth of ICCs over competing disordered heterocoagulation, which may require fine control of experimental parameters, especially when the free energy difference between the ordered and disordered phases is small.

Where the energy differences between structure types are small, a desired ICC can be preferentially nucleated using a template. For example, calculations performed using the techniques described above show that the wurtzite structure is very slightly favored over zincblende for all values of Q and $\Lambda$. For example, at $Q=1$, the Madelung sum for zincblende is 0.4% lower than that of wurtzite (per unit cell) for all values of $\Lambda$. However, the zincblende structure may be technologically important, especially in the field of photonics, due to its large photonic bandgap (see, e.g., Simconov, et al., *Physica B* 228:245, 1996). Using epitaxial techniques, such as an {001}-orientation template, the FCC-based polymorph can be rendered more energetically favorable (in the vicinity of the epitaxial surface) than the HCP polymorph, allowing growth of the metastable structure.

In another specific embodiment, fluorescent polymer spheres can be fabricated into an ICC having a photonic band gap prohibiting the fluorescence. This structure allows a population inversion to be created in the ICC. With the fabrication of a defect line in the ICC, a self-assembled laser could be produced.

Another specific embodiment involves producing ICCs of mixtures of magnetic and nonmagnetic particles. The resulting structures would be ordered arrays of isolated magnetic particles that could then be used for a variety of applications, including data storage. In addition, field-tunable material could be created by appropriate material selection. Since colloidal crystals are generally expected to be elastically soft (because of their porosity), the incorporation of electrically and magnetically active particles could allow high field response. Electro-optic, magneto-optic, ferroelectric, ferromagnetic, electrostrictive, and magnetostrictive colloidal crystals may all be produced using the methods of the invention.

Nonlinear-conduction devices based on rectifying junctions between dissimilar particles in the ICC may also be produced. Both Schottky-type heterojunctions and p-n junctions can be incorporated depending on the compounds used.

The combination of very high surface area and highly tailorable compositions for ICCs also suggests their usefulness as catalysts, biomaterials (e.g., as scaffolds for tissue growth), or drug delivery media. For example, ICCs can be used to create synthetic zeolites, in which nanoscale colloids would be crystallized to produce engineered mesoporous structures. Unlike present zeolites, the pore size would not be determined by atomic structure but by controlling the colloid particle size and crystal structure, and possibly by thermal densification (sintering) after crystallization. Since a great variety of transition metal oxides can be produced as colloids, catalytic and photocatalytic functions could also be designed into such crystals. Similarly, heterojunction-based gas and chemical sensors having a very fine structure may be produced.

For ICCs having anisotropic crystal structures, microfluidic materials and devices can make use of the controlled, anisotropic porosity of such materials. Mechanically unique structures such as negative Poisson's ratio materials may also be created using the anisotropy of certain ICC structures. For crystallites formed from submicron particles, crystallites may be held in suspension to be used as a scattering medium.

The methodologies presented herein are not limited to two component systems of spherical particles. ICC analogs to covalent or multicomponent crystals can be prepared that have a diversity as rich as mineral crystals. In direct analogy to the ionocovalent nature of real crystals, directional bonding can be introduced into ICCs to create structures preferred by covalent compounds, for example, by through the use of shaped nonspherical particles or through anisotropy in the surface charge on a spherical particle (such anisotropy may be introduced, for example, by utilizing crystalline anisotropy of the particle material, creating an "echo" of the anisotropic structure via the variation in surface charge.) Structures including perovskite and spinel may be produced utilizing a ternary system of particles. The breadth of possible structures and corresponding physical properties suggests potential applications in many fields including photonics, catalysis, structural applications, and biomaterials.

EXAMPLES

Example 1

Nucleation in a rocksalt structure has been demonstrated using 1.5 µm±2.5% silica spheres (Duke Scientific) and 0.76 µm±2% polystyrene functionalized with amidine (PSA) spheres (Interfacial Dynamics, Inc.). Class 1 isopropanol (General Chemical) was used as the solvent, which has a dielectric constant of 20.18, a density of 0.79 g/cm$^3$ at 68° F., a salt concentration of approximately $10^{-8}$ mol/L, and a Debye parameter of $6.5 \times 10^5$ m. Experiments were conducted at room temperature. In this suspension, the larger silica particles bear a negative surface charge (representing the anion), while the smaller PSA particles bear a positive surface charge (representing the cation). The size ratio of 1.974 was chosen to promote octahedral coordination of the PS by the silica. The zeta potential of the silica was measured on Zeta-PALS system (Brookhaven Instruments) to be −36.6 mV. The zeta potential of the PSA particles was measured to be 99.3 mV. κa is 0.51 for $SiO_2$ and 0.25 for PSA under these conditions.

The particles were vacuum filtered to remove any water. The particles were then repeatedly rinsed with 2-Propanol and then resuspended in the 2-Propanol via vortexing. The residual weight from drying a 1 mL sample of each mixture was used to determine the concentration of particles per unit volume. A mixture of 1:1 concentrations of silica and PSA was then produced. The resulting suspension was mixed with 2-Propanol to give an overall concentration of $10^9$ particles/mL. This solution was again vortexed for uniform mixing and then pipetted into 1 inch diameter Petri dishes. The dishes were dried and examined using scanning electron microscopy. In one region from 5 mL of mixture dried in a Petri dish, there were 3402 particles visible (1990 of silica and 1412 of PSA), 201 of which were ordered in 35 different clusters containing an average of 5.74 particles per cluster. These ordered clusters constituted 5.9% of the sample. This sample region was chosen at random to represent the entire sample. Certain regions did show a higher concentration of order and larger clusters.

Figure 5A:
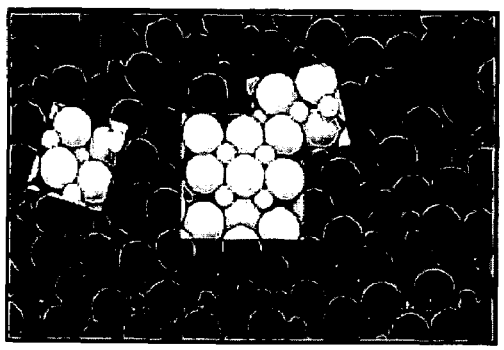
FIGS. 5a-5c are micrographs of crystallites of rock salt structure formed in an ICC.
Figure 5B:
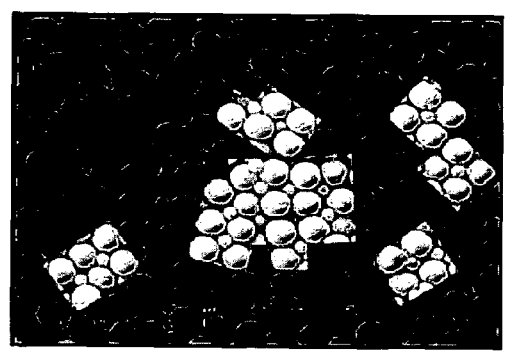
Figure 5C:
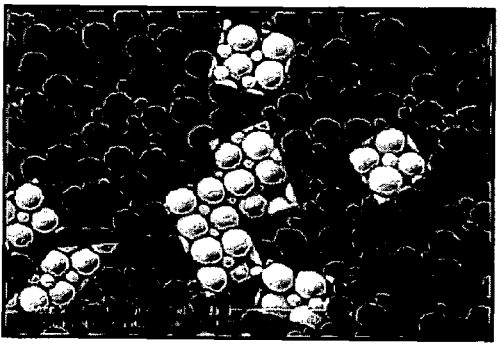

FIGS. 5a-5c are micrographs of the coagulated ICC, taken using an FEI/Philips XL30 FEG ESEM. Areas of rock salt ordering can be seen at the superimposed squares, which show {100} planes of individual ordered regions. Crystal vacancies can be observed at the edges of some ordered areas. Nucleation of rock salt-structure crystallites was observed in all samples tested, suggesting that heterocoagulation at the particle ratio necessary for order occurs spontaneously. The nucleation density in the samples was found to be about 1-5% area fraction for most samples. The nuclei exhibited surfaces of both {100} and {111} orientations. The remainder of the sample exhibited no identifiable crystallographic ordering. We believe that disorder and DLCA may be further minimized through proper control of experimental variables, such as particle uniformity and growth rate, and by controlling growth kinetics as discussed below.

Viewed from the perspective of classical nucleation and growth, the small size of the crystalline regions can be qualitatively understood to be the result of deep undercooling. There exists a "melting point" for an ICC that in this instance is well above room temperature. This "melting point" is the point at which the colloid would melt if the particles themselves were stable at arbitrarily high melting temperatures. (We estimate the melting point for our example system to be about 2500K, well above the melting point of the polystyrene spheres, based on the calculated interaction energy of 460 kT.) At room temperature, the nucleation rate is high and the growth rate low because the system is at a temperature so far below this "melting point."

To increase the growth rate, the effective temperature of the system may be raised using external energy sources (e.g., ultrasonication, agitation, fluid flow through the sample, or application of alternating electric or magnetic fields). Alternatively, growth can be promoted over unwanted nucleation by decreasing particle concentration to limit supersaturation, and controlling the rate at which particles are supplied, analogous to diffusion-limited liquid- or vapor-phase crystal growth processes.

Example 2

Figure 6A:
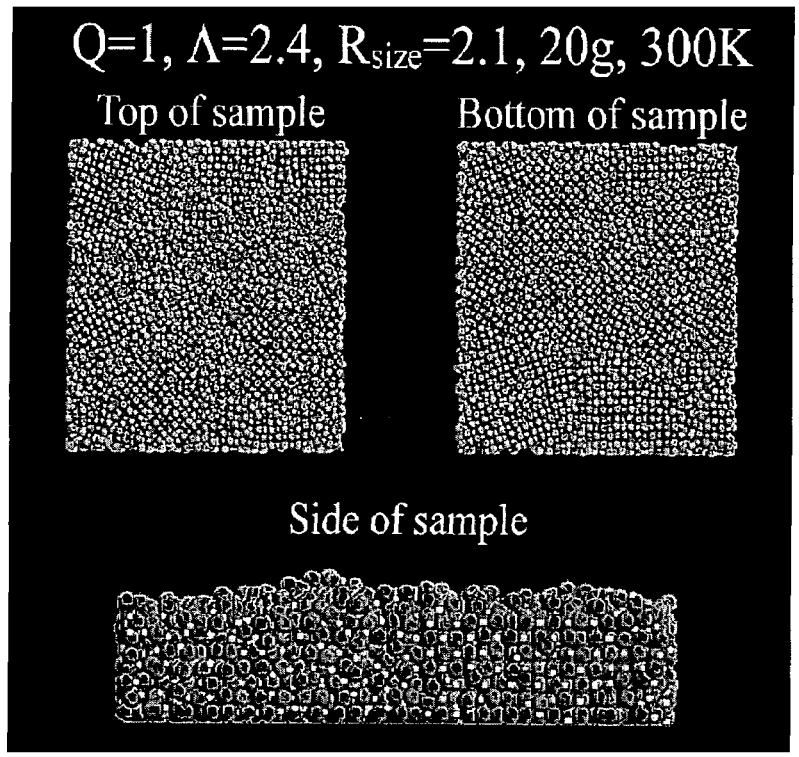
FIGS. 6a and 6b each show three views of a simulated ICC grown under an applied gravitational force.
Figure 6B:
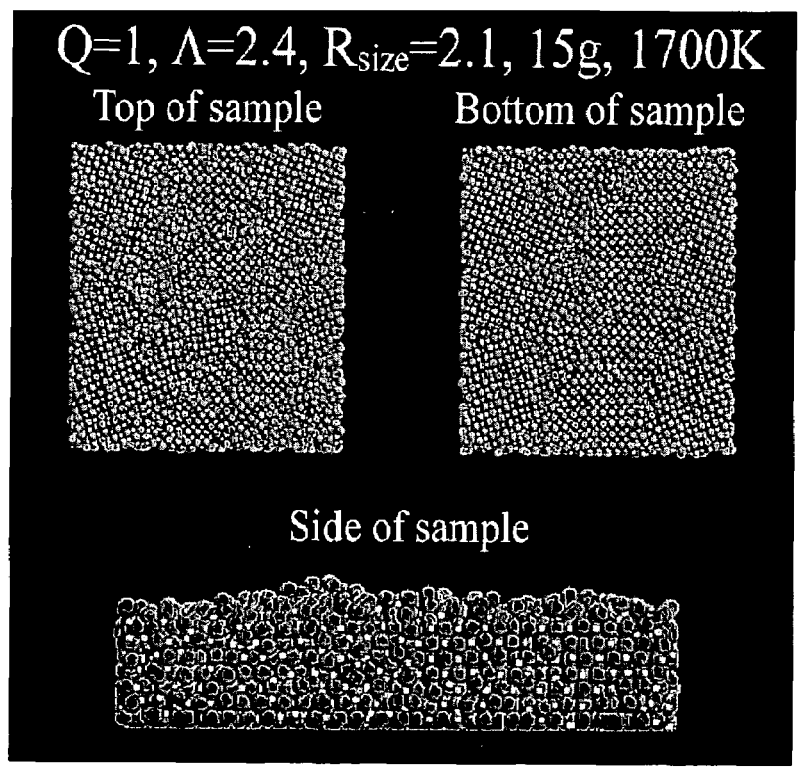

Particle dynamics simulations were conducted on 1.58 µm particles with a surface charge of −23.7 mV and 0.76 µm particles with a surface charge of 114 mV. The simulation was conducted with a salt concentration of $10^{-7}$ mol/L of counterions, giving the particles a charge ratio of Q=1 and a shielding ratio of Λ=2.4. The properties of 2-propanol were used for other variables. Simulations were conducted with Brownian thermal energies of 300K and 1700K. Nearly 100% ordering, with the exception of grain boundaries, occurred when the gravity in the system was increased to between 8 g and 30 g. The best ordering occurred in a range between 15 g and 20 g. The value of gravity needed correlates to the bond strength in the system, so for a system with stronger bonds, more force might be required to obtain the same effects. We believe the increased force is breaking up heterocoagulated colloidal gels that form and are kinetically trapped from reaching a dense crystalline state. The addition of gravitational force is not the only means through which this could be reached. Pressure could be applied directly to the wet colloids after settling breaking up the colloidal gels. In addition, a flow field could apply pressure to the colloids. Any means of adding a strong directional force to the colloids during crystallization should have a similar effect. Results of the simulation are shown in FIGS. 6a and 6b. Simulations have shown that this order can extend in upwards of 20 layers from the bottom surface. The top few layers are often more disordered due to surface roughness, so thick crystals should give a larger crystallized fraction.

Example 3

Figure 7:
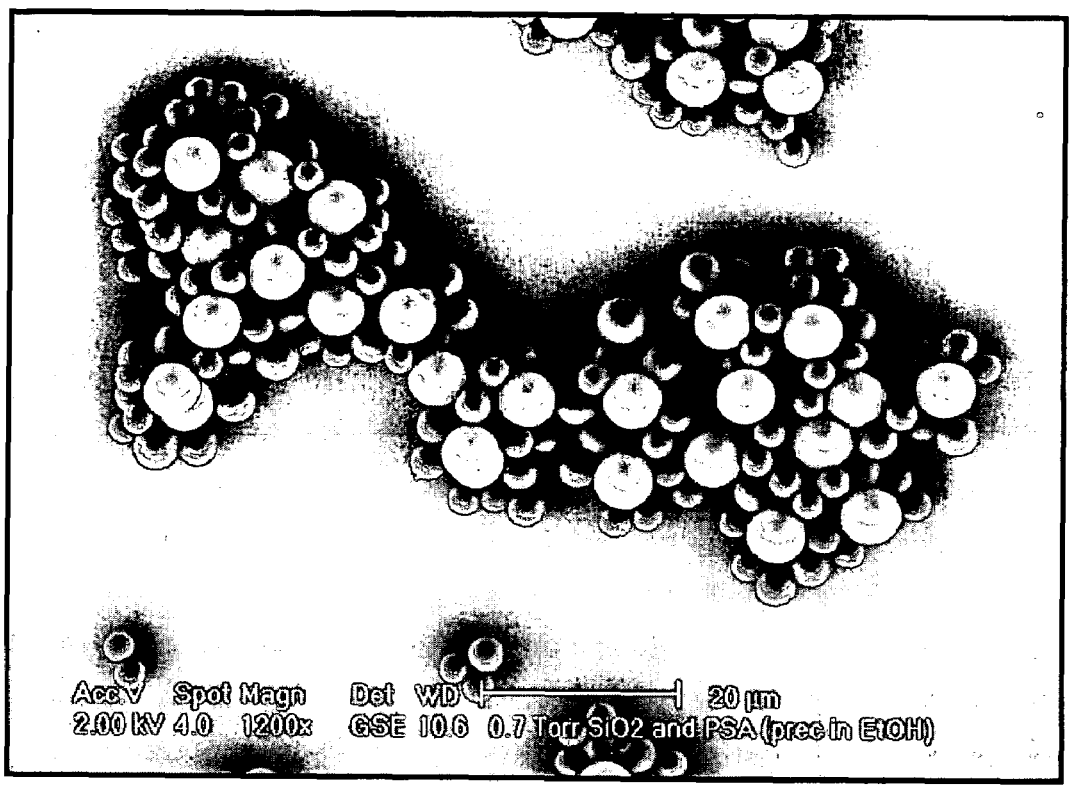
FIG. 7 shows a disordered heterocoagulate structure.

Example 1 was repeated using 3 µm PSA and 6 µm $SiO_2$ in water (salt concentration=$10^{-5.5}$, dielectric constant=78) giving a charge ratio of Q 18. The zeta potentials in water were approximately 60 mV for PSA and approximately −60 mV for $SiO_2$. The resulting disordered structure is shown in FIG. 7. Note the PSA surrounding the higher charged silica as tightly as possible. κ5.8*10^6 meters, giving a κa of 8.7 for the PSA and 17.5 for the SiO. This example demonstrates that our formulae can be used to identify systems that will not form crystallites.

Other embodiments of the invention will be apparent to those skilled in the art from a consideration of the specification or practice of the invention disclosed herein. It is intended that the specification and examples be considered as exemplary only, with the true scope and spirit of the invention being indicated by the following claims.

What is claimed is:

1. An ionic colloidal crystallite, comprising:
   an ordered array of particles, comprising at least a first group of particles of a first composition and at least a second group of particles of a second composition, wherein the at least a first group of particles and the at least a second group of particles have opposing surface charge, and wherein the ordered array is stabilized primarily by Coulombic interactions between the at least two compositions.
2. The ionic colloidal crystallite of claim 1, wherein the particles are substantially spherical.
3. The ionic colloidal crystallite of claim 2, wherein the particles of the first group all have substantially a same first diameter, and the particles of the second group all have substantially a same second diameter.
4. The ionic colloidal crystallite of claim 2, wherein the spherical particles have a selected surface charge and Debye length.
5. A photonic crystal comprising the ionic colloidal crystallite of claim 1.
6. The photonic crystal of claim 5, wherein the ionic colloidal crystallite has a wurtzite structure.
7. The photonic crystal of claim 5, wherein the ionic colloidal crystallite has a zincblende structure.
8. A nonlinear-conduction device comprising the ionic colloidal crystallite of claim 1, wherein the particles of the first group and the particles of the second group form rectifying junctions at their contact points.
9. The nonlinear-conduction device of claim 8, wherein the rectifying junctions are selected from the group consisting of Schottky junctions and p-n junctions.
10. The ionic colloidal crystallite of claim 1, wherein the ionic colloidal crystallite has a volume equivalent to at least two unit cells of crystal.
11. The ionic colloidal crystallite of claim 1, wherein the ionic colloidal crystallite has a volume equivalent to at least four unit cells of crystal.
12. The ionic colloidal crystallite of claim 1, wherein the ionic colloidal crystallite has a volume equivalent to at least ten unit cells of crystal.
13. The ionic colloidal crystallite of claim 1, wherein the ionic colloidal crystallite has a volume equivalent to at least fifty unit cells of crystal.
14. The ionic colloidal crystallite of claim 1, wherein the particles form a rock salt crystal structure.
15. The ionic colloidal crystallite of claim 1, wherein the particles form a cesium chloride crystal structure.
16. The ionic colloidal crystallite of claim 1, wherein the particles form a zincblende crystal structure.
17. The ionic colloidal crystallite of claim 1, wherein the particles form a wurtzite crystal structure.
18. The ionic colloidal crystallite of claim 1, wherein the particles form a crystal structure selected from the group consisting of fluorite, rutile, ruthenium oxide, and corundum.
19. The ionic colloidal crystallite of claim 1, wherein at least one of the first group and second group of particles comprises coated particles.
20. The ionic colloidal crystallite of claim 1, wherein at least one of the first group and second group of particles comprises functionalized particles.
21. The ionic colloidal crystallite of claim 1, further comprising a liquid medium surrounding the particles, wherein the surface charges of the first group and the second group of particles are determined by reaction with the liquid medium.
22. The ionic colloidal crystallite of claim 1, wherein at least some of the particles are nonspherical.
23. The ionic colloidal crystallite of claim 1, wherein the ordered array is additionally stabilized by van der Waals forces.
24. The ionic colloidal crystallite of claim 1, wherein the ordered array is additionally stabilized by depletion forces.
25. The ionic colloidal crystallite of claim 1, wherein the ordered array is additionally stabilized by an externally applied directional force.
26. The ionic colloidal crystallite of claim 1, wherein at least some of the particles carry anisotropic surface charge.
27. A self-assembled laser comprising the ionic colloidal crystallite of claim 1, wherein the first group or the second group of particles comprises a material that fluoresces at a selected wavelength, and wherein the ionic colloidal crystallite has a photonic band gap that prohibits fluorescence at the selected wavelength.

28. An active material comprising the ionic colloidal crystallite of claim 1, wherein the first group or the second group of particles comprises a material selected from the group consisting of electro-optic materials, magneto-optic materials, ferroelectric materials, ferromagnetic materials, electrostrictive materials, and magnetostrictive materials.

29. A catalyst comprising the ionic colloidal crystallite of claim 1.

30. A method of preparing an ionic colloidal crystallite, comprising:
providing a first suspension of particles having a first composition in a first solvent;
providing a second suspension of particles having a second composition in a second solvent;
mixing the first and second suspensions to form a mixed suspension of both particles, wherein the particles of the first composition and the particles of the second composition have opposing surface charge in the mixed suspension; and
coagulating the particles of the first and second compositions from the mixed suspension to form an ordered array stabilized primarily by Coulombic interactions between the particles of the first composition and the particles of the second composition.

31. The method of claim 30, wherein coagulating includes deposition of particles on a surface.

32. The method of claim 31, wherein the surface promotes ordering of the formed array.

33. The method of claim 32, wherein the surface comprises structures selected from the group consisting of lines, gratings, ledges, steps, grids, and ordered particles.

34. The method of claim 30, further comprising applying a directional force to the particles during coagulation.

35. The method of claim 34, wherein the directional force is selected from the group consisting of gravitational force and centrifugal force.

36. The method of claim 30, wherein the particles are substantially spherical.

37. The method of claim 36, wherein the particles of the first suspension all have substantially a same first diameter, and the particles of the second suspension all have substantially a same second diameter.

38. The method of claim 36, wherein the spherical particles have a selected surface charge and Debye length.

39. The method of claim 30, further comprising adding kinetic energy to the mixed suspension during coagulation.

40. The method of claim 39, wherein adding kinetic energy comprises a step selected from the group consisting of: ultrasonification of the mixed suspension; flowing a fluid through the mixed suspension; agitation of the mixed suspension; and application of an alternating electric or magnetic field to the mixed suspension.

41. The method of claim 30, wherein the ordered array has a volume equivalent to at least two unit cells of crystal.

42. The method of claim 30, wherein the ordered array has a volume equivalent to at least four unit cells of crystal.

43. The method of claim 30, wherein the ordered array has a volume equivalent to at least ten unit cells of crystal.

44. The method of claim 30, wherein the ordered array has a volume equivalent to at least fifty unit cells of crystal.

45. The method of claim 30, wherein mixing takes place adjacent to the site of ordering.

46. The method of claim 30, further comprising applying an electrical or magnetic field to the particles during coagulation.

47. The method of claim 30, wherein the particles form a rock salt crystal structure.

48. The method of claim 30, wherein the particles form a cesium chloride crystal structure.

49. The method of claim 30, wherein the particles form a zincblende crystal structure.

50. The method of claim 30, wherein the particles form a wurtzite crystal structure.

51. The method of claim 30, wherein the particles form a crystal structure selected from the group consisting of fluorite, rutile, ruthenium oxide and corundum.

52. The method of claim 30, wherein at least one of the first suspension of particles and the second suspension of particles comprises coated particles.

53. The method of claim 30, wherein at least one of the first suspension of particles and the second suspension of particles comprises functionalized particles.

54. The method of claim 30, further comprising a liquid medium surround the particles, wherein the surface charges of the particles are determined by reaction with a liquid medium of the mixed suspension.

55. The method of claim 30, wherein at least some of the particles are nonspherical.

56. The method of claim 30, wherein the ordered array is additionally stabilized by van der Waals forces.

57. The method of claim 30, wherein the ordered array is additionally stabilized by depletion forces.

58. The method of claim 30, wherein the ordered array is additionally stabilized by an external directional force.

59. The method of claim 30, wherein at least some of the particles carry anisotropic surface charge.

60. A method of preparing an ionic colloidal crystallite, comprising:
providing a first suspension of particles having a first composition in a first solvent;
providing a second suspension of particles having a second composition in a second solvent;
coagulating the particles of the first and second compositions by sequential addition of the first and second suspensions to form an ordered array stabilized primarily by Coulombic interactions between the particles of the first composition and the particles of the second composition.

61. A method of selecting materials for an ionic colloidal crystallite to obtain a desired crystal type having a selected stoichiometry, comprising:
selecting at least a first and a second particle composition, a first and a second particle radii $a_1$ and $a_2$, and a solvent composition, wherein:
particles of the first composition suspended in the solvent have a surface potential of $\Psi_1$;
particles of the second composition suspended in the solvent have a surface potential of $\Psi_2$; and
the solvent has a reciprocal Debye length of $\kappa$;
calculating a charge ratio Q as $$-\frac{a_1 \Psi_1 \exp(\kappa a_1)}{a_2 \Psi_2 \exp(\kappa a_2)};$$

calculating a dimensionless length $\Lambda$ as $\kappa(a1+a2)$;
calculating an ionic radius ratio r as $$\frac{a_1}{a_2};$$

using Pauling's Rules and r to determine favored crystal structure types;

calculating the Madelung constant for each favored crystal type having a stoichiometry matching the selected stoichiometry;

determining the stable phase as the favored crystal type having the highest Madelung constant; and adjusting the selected first and second particle compositions, first and second particle sizes, and solvent compositions until the stable phase matches the desired crystal type.

* * * * *